United States Patent
Christen et al.

(10) Patent No.: US 10,523,234 B2
(45) Date of Patent: Dec. 31, 2019

(54) SIGNAL PROCESSING ARRANGEMENT, SENSOR ARRANGEMENT AND SIGNAL PROCESSING METHOD

(71) Applicant: ams AG, Premstaetten (AT)

(72) Inventors: Thomas Christen, Zurich (CH); Colin Steele, Midlothian (GB); Thomas Froehlich, Ottikon Bei Kemptthal (CH)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/083,206

(22) PCT Filed: Apr. 5, 2017

(86) PCT No.: PCT/EP2017/058119
§ 371 (c)(1),
(2) Date: Sep. 7, 2018

(87) PCT Pub. No.: WO2017/182272
PCT Pub. Date: Oct. 26, 2017

(65) Prior Publication Data
US 2019/0115932 A1    Apr. 18, 2019

(30) Foreign Application Priority Data
Apr. 19, 2016 (EP) .................. 16165986

(51) Int. Cl.
*H03M 3/00* (2006.01)
*H03M 1/12* (2006.01)
*H03M 1/68* (2006.01)

(52) U.S. Cl.
CPC .......... *H03M 3/49* (2013.01); *H03M 1/1295* (2013.01); *H03M 1/68* (2013.01); *H03M 3/464* (2013.01)

(58) Field of Classification Search
CPC ........ H03M 3/49; H03M 1/1295; H03M 1/68; H03M 3/464
(Continued)

(56) References Cited

U.S. PATENT DOCUMENTS 10,025,441 B2* 7/2018 Ryshtun ............... H03K 17/962
10,317,250 B2* 6/2019 McDavid ................. G01D 5/24
(Continued)

FOREIGN PATENT DOCUMENTS

EP    1087393       3/2001
JP    2012/120083   6/2012

OTHER PUBLICATIONS

Baker, "How delta-sigma ADCs work, Part 1", Texas Instruments Incorporated, Data Acquisition, Analog Applications Journal, 3Q 2011 www.ti.com/aaj; 6 pages.
(Continued)

*Primary Examiner* — Brian K Young
(74) *Attorney, Agent, or Firm* — Fish & Richardson P.C.

(57) ABSTRACT

A signal processing arrangement has a signal input for connecting a capacitive sensor. An amplifier circuit is coupled between the signal input and a feedback point. A loop filter is coupled downstream to the feedback point. A quantizer is connected downstream to the loop filter and provides a multi-bit output word. The multi-bit output word consists of one or more higher significance bits and one or more lower significance bits. A first feedback path is coupled between a quantizer and the feedback point for providing a first feedback signal to the feedback point being representative of the one or more lower significance bits. A second feedback path is coupled to the quantizer for providing a second feedback signal to the signal input being representative of the one or more higher significance bits.

19 Claims, 3 Drawing Sheets

(58) Field of Classification Search
USPC .......................................................... 341/143
See application file for complete search history.

(56) References Cited

U.S. PATENT DOCUMENTS

| | | | |
|---|---|---|---|
| 10,386,953 B2* | 8/2019 | Wilkinson | G06F 3/0416 |
| 10,386,969 B1* | 8/2019 | Moyal | G06F 3/044 |
| 2015/0042496 A1 | 2/2015 | Straeussnigg et al. | |
| 2015/0180333 A1 | 6/2015 | Jenkner et al. | |

OTHER PUBLICATIONS

He et al., "A Multibit Delta-Sigma Modulator with Double Noise-Shaped Segmentation", IEEE Transactions on Circuits and Systems// Express Briefs, vol. 62, No. 3, Mar. 2015.

Chan et al., "Segmented Dynamic Element Matching for High-Resolution Digital-to-Analog Conversion", IEEE Transactions on Circuits and Systems// IEEE// Regular Papers, vol. 55, No. 11, Dec. 2008.

European Patent Office, International Search Report for PCT/EP2017/058119, dated Jun. 6, 2017.

\* cited by examiner

SIGNAL PROCESSING ARRANGEMENT, SENSOR ARRANGEMENT AND SIGNAL PROCESSING METHOD

BACKGROUND OF THE INVENTION

The present disclosure relates to a signal processing arrangement, to a sensor arrangement with such signal processing arrangement and to a signal processing method, each processing a signal from a capacitive sensor.

Sensors with capacitive properties are widely used. For example, many micro electro mechanical systems, MEMS, sensors, like MEMS microphones, have a varying capacitance depending on the value to be sensed.

MEMS microphones are an example of a capacitive sensor application where a very high input dynamic range needs to be supported. The signal of the capacitive sensor may have peak values at the input that might even exceed the supply rails of an associated signal processing circuit. For example, such a signal may need to be compressed to fit within the signal swing given a limited supply voltage of a first amplifier of the signal processing circuit. Due to the strict noise requirements and usually small sensor capacitances, a conversion of the signal into a charge domain or current domain is usually not possible. One option is to compress the signal directly at the input pin of the first amplifier into the supply range, before it gets into an active circuitry, where clipping may happen.

To compress the signal is challenging, as the signal information may get distorted by the compression. For example, in conventional approaches, the signal may be attenuated or clipped directly at the input pin, in case it exceeds the input range.

SUMMARY OF THE INVENTION

The present disclosure provides an improved signal processing concept which allows processing of capacitive sensors with a high dynamic range.

The improved signal processing concept is based on the idea that an actual, digital output value of the overall signal processing is evaluated to determine whether an input signal of a capacitive sensor at the input of a first amplifier circuit is well within the operating range of the first amplifier circuit. For example, at least a portion of the digital output value is used to selectively shift the level of the input signal into the operating range of the amplifier circuit depending on the actual output value of the signal processing downstream to the signal input. In particular, a signal representative of one or more higher significance bits of a digital output signal is fed back to the signal input for performing a respective level shifting. Accordingly, the resulting signal, being processed by some amplification, will reliably be in the desired operating range. For example, the feedback of the one or more higher significance bits may be part of a segmented feedback of a sigma-delta modulation scheme that is used to generate a digital representation of the sensor signal of the capacitive sensor.

The capacitive sensor may be implemented as a capacitive MEMS sensor. Examples of such MEMS sensor are MEMS microphones or MEMS pressure sensors, biosensors or others.

With the sigma-delta modulation concept, the level shifting at the signal input does not have be compensated at a signal output by additional measures, as some kind of feedback is systematically included in the sigma-delta modulation. Accordingly, no signal observation at the signal input because of, e.g. high input amplitudes and/or zero crossings, has to be performed, because the feedback of the sigma-delta modulation already tracks the input signal. In contrast, by segmentation of the sigma-delta modulation feedback, it is possible to distinguish between smaller input signals and large input signals represented by the higher significance bits.

For example, in an embodiment of a signal processing arrangement for a capacitive sensor according to the improved signal processing concept, a signal input is present for connecting the capacitive sensor. An amplifier circuit is coupled to the signal input at its input side and to a feedback point at its output side. A loop filter is coupled downstream to the feedback point. A quantizer connected downstream to the loop filter is configured to provide a multi-bit output word based on a signal at an input of the quantizer. The multi-bit output word consists of one or more higher significance bits and one or more lower significance bits. The signal processing arrangement further comprises a first and a second feedback path. The first feedback path is coupled between an output of the quantizer and the feedback point for providing a first feedback signal to the feedback point. The first feedback signal is representative of the one or more lower significance bits. The second feedback path is coupled to the output of the quantizer for providing a second feedback signal to the signal input. The second feedback signal is representative of the one or more higher significance bits. In particular, the second feedback signal corresponds to the one or more higher significance bits of an actual value of the multi-bit output word of the quantizer. In addition, the multi-bit output word particularly corresponds to an actual value of the signal at the input of the quantizer.

According to the improved concept, the digital output word is separated or segmented in two parts, wherein the one or more higher significance bits form the basis for the feedback to the signal input, and the one or more lower significance bits form the basis for a feedback to the loop filter. For example, the loop filter, the quantizer and the two feedback paths together form the basic structure of the sigma-delta modulation.

During operation of the signal processing arrangement, if the input signal provided by the capacitive sensor is well within the operating range of the amplifier circuit and, accordingly, the one or more higher significance bits have a zero value, the second feedback path effectively does not provide any change to the input signal. However, if the signal amplitude of the input signal increases such that at least one of the one or more higher significance bits results to be a logical one, a non-zero value is fed back to the signal input, thus shifting the level of the input signal provided by the capacitive sensor. Hence, the resulting signal at the amplifier circuit's input will still be well in the operating range of the amplifier circuit.

For example, the first feedback path and the second feedback path each provide negative feedback. Accordingly, with the negative value the signal at the amplifier circuit's input is always shifting in the direction towards the defined operating range of the amplifier circuit. For example, if the signal provided by the capacitive sensor exceeds the upper range of the amplifier circuit, the negative feedback shifts the signal in order to decrease the resulting signal, while the resulting signal is increased, if the signal provided by the capacitive sensor is at the lower, potentially negative order of the operating range.

The digital output word may be represented as a signless digital value. However, it is also possible that the digital output word may contain algebraic sign information.

Accordingly, in some implementations the first feedback path and/or the second feedback path are configured to employ algebraic sign information for providing feedback. Again, this ensures that the shifting at the signal input is performed in the, so to say, right direction.

In various implementations of the signal processing arrangement, the quantizer is configured to provide the multi-bit output word with a predefined sampling frequency. Such a sampling frequency is usually much higher than a maximum frequency of a signal to be processed.

In some implementations the second feedback path provides the second feedback signal to the signal input with that sampling frequency. For example, the loop filter is at least partially implemented with discrete time elements operating with the sampling frequency.

In further implementations, the sampling frequency is at least one order of magnitude higher than a maximum frequency of a predefined frequency band of interest. For example, the sampling frequency is twenty times, thirty times, forty times, fifty times, sixty times or even up to a hundred times higher than the maximum frequency of the predefined frequency band of interest. Of course, higher factors are not excluded.

For an actual implementation of the signal processing arrangement according to the improved concept, there are various possibilities, e.g. for building the loop filter. For example, the loop filter can be built completely with continuous time filter elements, completely with discrete time switched capacitor arrangements, or completely as a digital filter. Furthermore, the loop filter can be implemented with a combination of such analog, continuous time, switched capacitor or digital filters. Such implementations of loop filters in sigma-delta modulators are well-known in the art and therefore not described in more detail here.

Accordingly, also the integrating component of the sigma-delta modulator can be implemented with anything from a continuous time integrator to a fully digital integration. Based on the specific implementations of the loop filter and the integrating component, also the implementation of the feedback paths can vary. In particular the way the first feedback path provides the first feedback signal to the feedback point for combining the first feedback signal with the output signal of the amplifier circuit may be chosen according to the implemented filter structure.

Hence, in some implementations the first feedback path and/or the second feedback path comprise at least one of a sigma-delta digital-to-analog converter, a pulse-width modulator, a current digital-to-analog converter, a switched capacitor circuit, a digitally controlled level shifter, to name only a few.

In some implementations, the second feedback path comprises one or more level shift capacitors having a first end connected to the signal input and a second end coupled to at least one reference voltage source via an associated switch that is controlled on the basis of the one or more higher significance bits. For example, by the setting of the respective switches, the signal representing the one or more higher significance bits can be provided to the signal input as a corresponding shifting voltage. If the one or more higher significance bits carry algebraic sign information, the resulting shifting voltage can be provided as a positive or a negative shifting voltage. If all of the one or more higher significance bits have a zero value, the one or more level shift capacitors may be connected to a fixed reference potential like a ground potential. It should be apparent to the skilled reader that various options for decoding the one or more higher significance bits and deriving a respective shifting voltage exist.

In an alternative implementation, the signal processing arrangement comprises a bias connection. The signal processing arrangement is configured for connecting the capacitive sensor between the signal input and the bias connection. The second feedback path comprises at least one bias filter capacitor having a first end connected to the bias connection and a second end coupled to at least one reference voltage source via an associated switch that is controlled on the basis of the one or more higher significance bits.

For example, the bias connection is further connected to a charge pump for providing a bias voltage that is higher than an actual supply voltage of the signal processing arrangement. In this case, the one or more bias filter capacitor(s) may also act as filter capacitors for the charge pump. Such filter capacitors may have a capacitance value that is larger, e.g. significantly larger, than the capacitance of the capacitive sensor. In such a configuration, the influence on the capacitive sensor may be neglected.

Similarly as described for the previous example, the respective switches achieve that a reference voltage for the one or more filter capacitors, which usually is a ground level, is shifted according to the connected reference voltage source. If all of the one or more higher significance bits have a zero value, the one or more filter capacitors may be connected to a fixed reference potential like a ground potential.

In various implementations the improved signal processing concept can be combined with noise shaping techniques. For example, such noise shaping techniques may be useful for equalizing a mismatch between the higher significance bits and the lower significance bits.

For example, the quantizer may comprise a digital sigma-delta modulator for providing the one or more higher significance bits and the one or more lower significance bits from the multi-bit output word.

In another implementation, a noise coupling can be performed with the lower significance bits, e.g. by feeding back a delayed version of the lower significance bits to the input of the quantizer and filtering the lower significance bits accordingly.

A signal processing arrangement according to the embodiments described above, can be implemented on a single chip, e.g. in an integrated circuit, to which the capacitive sensor can be connected. However, it is also possible to integrate the capacitive sensor and the signal processing arrangement on the same integrated circuit.

For example, a sensor arrangement comprises a signal processing arrangement according to one of the embodiments described above and a capacitive sensor connected to the signal input.

Although the improved signal processing concept has been described in conjunction with specific circuit elements, the improved signal processing concept can also be described in more general terms, for example by method of a signal processing method.

An embodiment of a signal processing method for processing a signal of a capacitive sensor according to the improved concept comprises amplifying an input signal to generate an intermediate signal. The intermediate signal is combined with a first feedback signal to generate a combination signal. The combination signal is filtered with a loop filter to generate a filtered signal. The filtered signal is quantized to provide a multi-bit output word, which consists of one or more higher significance bits and one or more lower significance bits. The first feedback signal is generated as being representative of the one or more lower significance bits. A second feedback signal is generated as being representative of the one or more higher significance bits. The second feedback signal is combined with the signal of the capacitive sensor to generate the input signal.

As described above, for example the first feedback signal and the second feedback signal each provide negative feedback. The first feedback signal and/or the second feedback signal may employ algebraic sign information for providing feedback.

In various implementations, the provision of the multi-bit output word and the generation of the second feedback signal are performed with a predefined sampling frequency.

Further implementations of the signal processing method easily become apparent for the skilled person from the description of the various embodiments of the signal processing arrangement above.

BRIEF DESCRIPTION OF THE DRAWINGS

The improved signal processing concept will be described in more detail below for several embodiments with reference to the drawings. Identical reference numerals designate elements or components with identical functions. In so far as elements or components correspond to one another in function, a description of them will not be repeated in each of the following figures.

In the figures.

DETAILED DESCRIPTION

Figure 1:
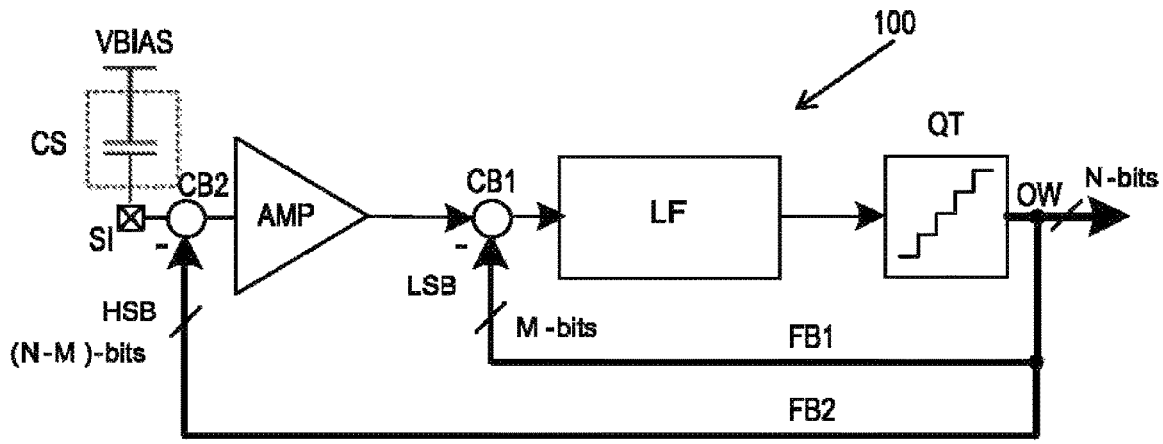
FIG. 1 shows an example implementation of a signal processing arrangement with a capacitive sensor.

FIG. 1 shows an example implementation of a sensor arrangement with a signal processing arrangement 100 and a capacitive sensor CS connected to a signal input SI of the signal processing arrangement 100. As a non-limiting example, the capacitive sensor CS may be implemented as a capacitive MEMS sensor. Examples of such MEMS sensor are MEMS microphones or MEMS pressure sensors, biosensors or others. In typical implementations, the capacitive sensor CS is connected between a bias voltage connection VBIAS and a signal input SI, which forms the input of the signal processing arrangement 100.

The signal input SI is coupled to an input of an amplifier circuit AMP via a combiner CB2. An output of the amplifier circuit AMP is coupled to a loop filter LF via a further combiner CB1. An output of the loop filter LF is connected to a quantizer QT, whose output forms a signal output of the signal processing arrangement 100. The quantizer QT particularly provides a multi-bit output word OW having a word length of N bits. In particular, the multi-bit output word OW corresponds to an actual value of the signal at the input of the quantizer QT. A first and a second feedback path FB1, FB2 are coupled to the output of the quantizer QT. The first feedback path FB1 ends at the combiner CB1, which acts as a feedback point and can also be called a first combiner. The second feedback path FB2 ends at the combiner CB2, which is also called the second combiner CB2.

The N-bit output word OW consists of one or more lower significance bits LSB and one or more higher significance bits HSB. In particular, the output word OW consists of M lower significance bits LSB and (N−M) higher significance bits HSB, thus realizing a segmented feedback.

During operation, the first feedback path provides a first feedback signal to the feedback point CB1, the first feedback signal being representative of the one or more lower significance bits. Accordingly, the second feedback path FB2 provides a second feedback signal to the signal input SI respectively the second combiner CB2, the second feedback signal being representative of the one or more higher significance bits HSB. The first and the second feedback path FB1, FB2 realize, so to say, a segmented feedback. More generally speaking, the structure with the loop filter LF, the quantizer QT and the feedback paths FB1, FB2 realize a structure like a sigma-delta-analog-to-digital converter for the analog sensor signal provided by the capacitive sensor CS. Particularly, the second feedback signal corresponds to the one or more higher significance bits HSB of an actual value of the multi-bit output word OW.

The signal provided by the capacitive sensor CS may have a high dynamic range. It may not be possible to convert the signal of the capacitive sensor into a charge domain or current domain, in particular if the capacitance value of the capacitive sensor is small. This might the case for various MEMS sensors having a capacitance in the order of e.g. 500 femtofarad, fF. If a signal amplitude of the capacitive sensor signal exceeds the dynamic range of the amplifier circuit AMP, valuable signal information may be lost in conventional systems. However, according to the improved signal processing concept, the second feedback signal being representative of the higher significance bits can provide a level shifting of the signal resulting at the input of the amplifier circuit AMP, such that the amplifier circuit AMP is always operated in its safe operating range.

For example, for small input signals, only the lower significance bits are active, i.e. have at least some non-zero values. The one or more higher significance bits are zero for such small input signals, such that the signal of the capacitive sensor is not changed or effected by the second feedback path FB2. However, if the signal from the capacitive sensor CS increases, one or more of the higher significance bits gets a non-zero value, resulting in a non-zero signal of the second feedback signal. In particular, the input signal voltage swing is reduced at the second combiner CB2 with the second feedback signal. Accordingly, the segmentation between the lower significance bits LSB and the higher significance bits HSB may be selected such that the higher significance bits HSB become active, i.e. non-zero, if the input signal provided by the capacitive sensor CS leaves the safe operating range of the amplifier circuit AMP.

Preferably, the first and the second feedback path FB1, FB2 provide negative feedback, indicated by the minus signs at the first and the second combiner CB1, CB2, resulting in the reduction, if any, of the signal at the combiners' input. Of course, the feedback signals can carry algebraic sign information, such that a negative value in the respective feedback path results in a positive contribution to the signal at the respective combiner.

It should be noted that the arrangement shown in FIG. 1 represents only a very generic implementation of the improved signal processing concept. In particular, there are various options for implementing the loop filter LF, the quantizer QT, the feedback paths FB1, FB2 and the combiners CB1, CB2. For example, for each of the feedback paths it can be selected that they comprise one of e.g. a sigma-delta digital-to-analog converter, a pulse-width modulator, a current-digital-to analog converter, a switched capacitor circuit, a digitally controlled level shifter or other well-known implementations for processing digital values. The loop filter can be implemented as a fully analog solution with arbitrary combinations of continuous time and discrete time filter approaches, as well as switched capacitor solutions. It is also possible to implement the loop filter at least partially with digital filters.

Figure 2A:
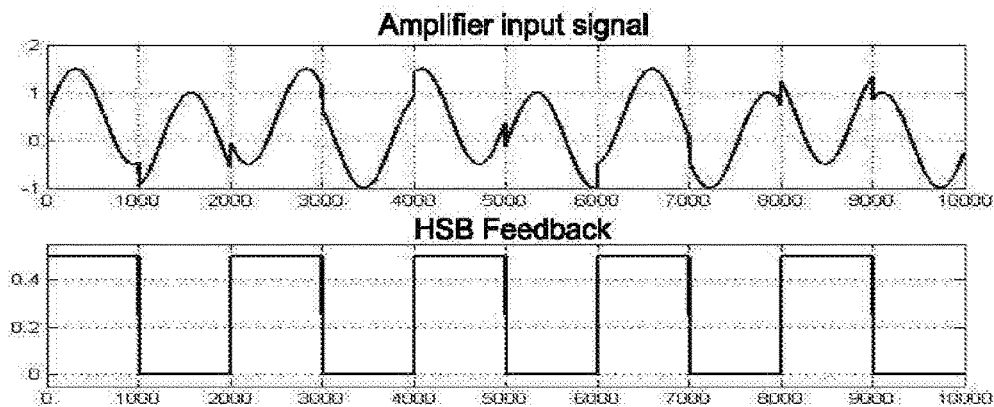
FIG. 2A and FIG. 2B show time domain diagrams of example signals within implementations of the signal processing arrangement.
Figure 2B:
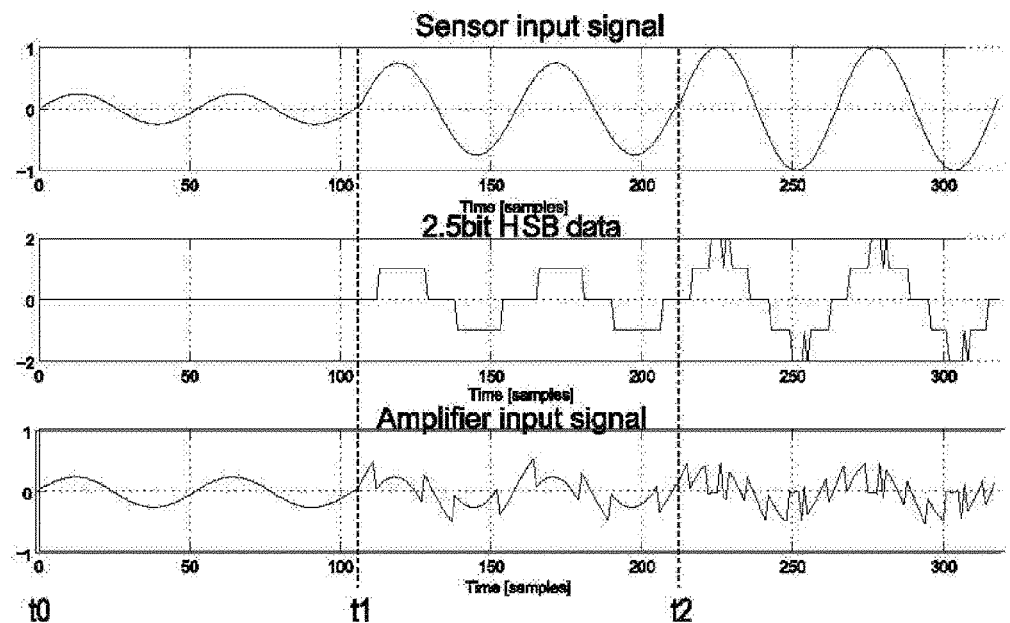

FIG. 2A and FIG. 2B show example time domain diagrams of signals in example implementations of the signal processing arrangement employing the improved signal processing concept.

For example, the upper chart of FIG. 2A shows a signal diagram of an input signal of the amplifier circuit AMP resulting from a larger input signal of a capacitive sensor and a single bit feedback signal corresponding to one higher significant bit shown in the lower chart of FIG. 2A. As can be seen at the switching instances in FIG. 2A, the resulting input signal in the upper chart is always shifted into a predefined signal range. It should be noted that this example only has an illustrative character and does not necessarily represent an actual or practical case. In particular, the switching of the higher significance bits is usually performed with a sampling frequency of the quantizer QT, which usually is significantly higher than a signal frequency of the input signal.

FIG. 2B shows a further example time domain diagram, wherein the upper chart shows the original sensor input signal provided by the capacitive sensor CS. The middle chart shows the second feedback signal being representative of two higher significance bits together with algebraic sign information, which can also be called 2.5 bit HSB data. The lower chart shows the resulting input signal of the amplifier circuit AMP after the second combiner CB2.

In a first time segment between time instance t0 and t1, the sensor input signal is well within the operating range of the amplifier circuit AMP, such that the higher significance bits HSB remain zero during that timeframe. Accordingly, the amplifier input signal is identical to the sensor input signal.

In the second timeframe between the time instants t1 and t2, the sensor input signal is increased such that the bit with the second highest significance becomes active for the higher signal amplitudes from time to time. Accordingly, the amplifier input signal results to be in the safe operating range of the amplifier circuit due to the shifting by the second feedback signal.

In the third timeframe after the time instant t2, the sensor input signal is further increased such that both the first and the second higher significance bits become active, resulting in an increased shifting activity. The result of the shifting can be seen for the amplifier input signal, which, again, is in the safe operating range of the amplifier circuit AMP.

It should be apparent to the skilled reader that the example of 2.5 higher significance bits is only chosen as an example and that a higher or lower number of bits can also be employed according to the same concept. As can be seen from FIG. 2B, it is not necessary that the higher significance bits each have a different weight, e.g. that each bit has double the weight of the previous bit. In contrast, according to the example of FIG. 2B, a thermometer code may be used where each bit has the same weight. However, the selection depends on the implementation of the quantizer, which should be apparent to the skilled reader.

Figure 3:
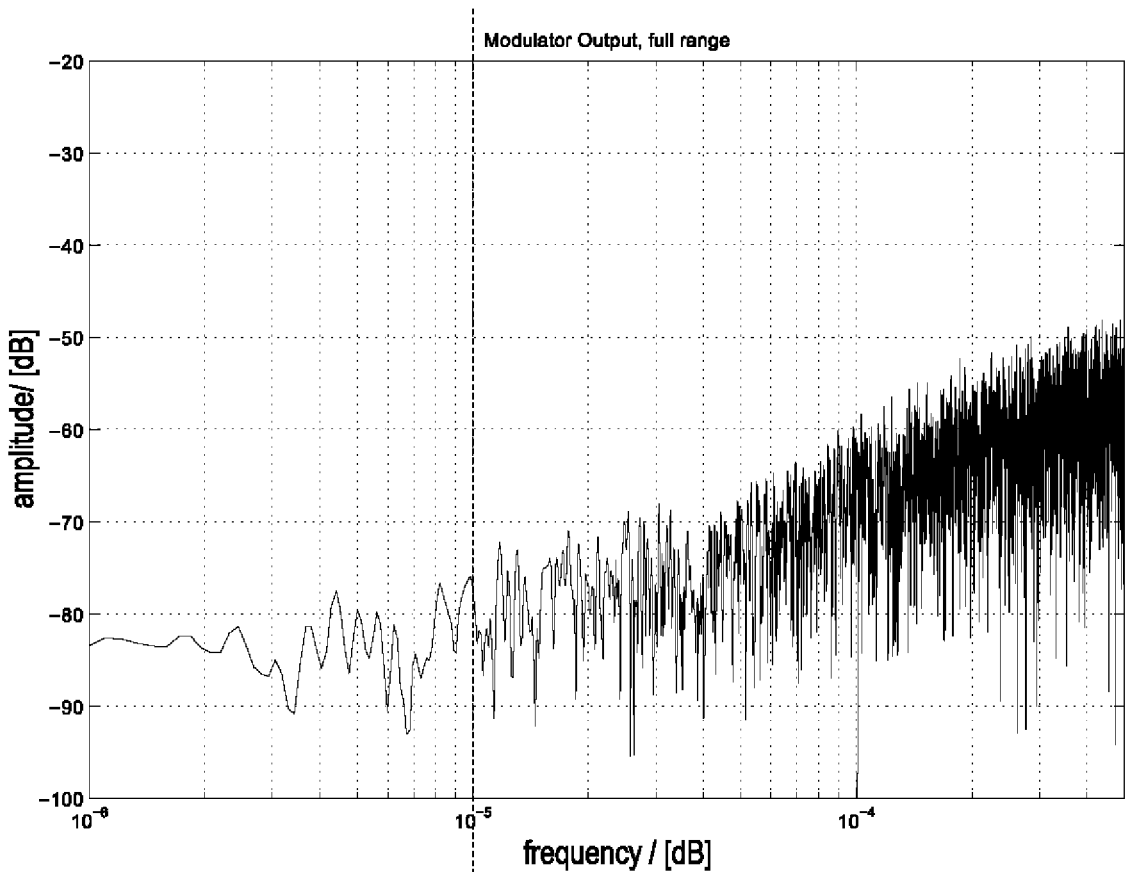
FIG. 3 shows an example frequency domain diagram of a feedback signal.

FIG. 3 shows a frequency domain diagram of the second feedback signal as an example. As mentioned before, the switching frequency in the second feedback path FB2 may correspond to the sampling frequency of the quantizer QT. Such a sampling frequency may be at least one order of magnitude higher than a maximum frequency of a predefined frequency band of interest of the input signal provided by the capacitive sensor CS.

For example, the sampling frequency may be 2 to 6 multiples of 10 higher than said maximum frequency in the input signal, given as a non-limiting example. FIG. 3 shows the switching activity both in the frequency band of interest and above said frequency band of interest, the separation being designated by the dashed line in the diagram. As can be seen from FIG. 3, the main switching activity is in the higher frequency band outside the frequency band of interest. For example, if the capacitive sensor is embodied as a MEMS microphone, the frequency band of interest may go up to 22 kHz or 24 kHz or 48 kHz, for example.

If mismatch between the one or more lower significance bits LSB and the one or more higher significance bits HSB is an issue, it is possible to apply additional noise shaping techniques to the signal processing arrangement.

Figure 4:
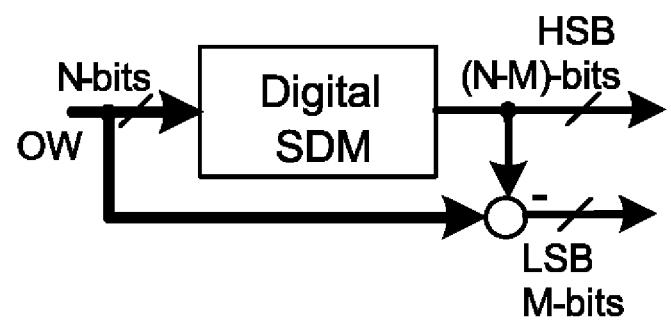
FIG. 4 shows an example implementation of a digital sigma-delta modulator.

For example, a structure as shown in FIG. 4 may be included in the quantizer QT or added to the output of the quantizer QT. FIG. 4 shows an example implementation of a noise shaping technique, where the N bits of the output word OW are processed with a digital sigma-delta modulator SDM. The output of the digital sigma-delta modulator SDM are the N-M noise shaped higher significance bits HSB, which are subtracted from the full output word OW to generate the M-bits of the lower significance bits. In particular, the HSB data is obtained by re-quantization with the digital sigma-delta modulator SDM, which results in noise shaping of the error between the higher significance bits HSB and the lower significance bits LSB.

Figure 5:
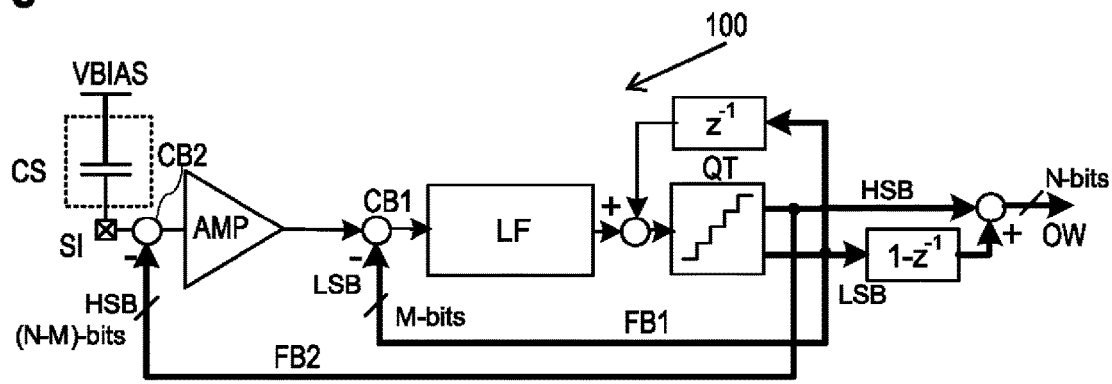
FIG. 5 shows a further example implementation of a signal processing arrangement.

FIG. 5 shows a further implementation example of a sensor arrangement with a signal processing arrangement 100 and a capacitive sensor CS. The example implementation of FIG. 5 is mainly based on the implementation of FIG. 1. Hence, only the differences will be explained in detail. The feedback mechanism with the first feedback path FB1 and the second feedback FB2 is unchanged.

In the example implementation of FIG. 5, the one or more lower significance bits LSB is provided back to the input of the quantizer QT via a single step delay element denoted by the discrete operation $z^{-1}$. To compensate for this operation, the same set of lower significance bits is provided to a processing block having the discrete operation $1-z^{-1}$. The output of said processing block is combined with the one or more higher significance bits HSB in order to form the N-bit output word OW.

The two additional processing blocks implement a noise coupling approach, which performs a first order noise shaping of a potential mismatch between the higher significance bits HSB and the lower significance bits LSB.

Figure 6:
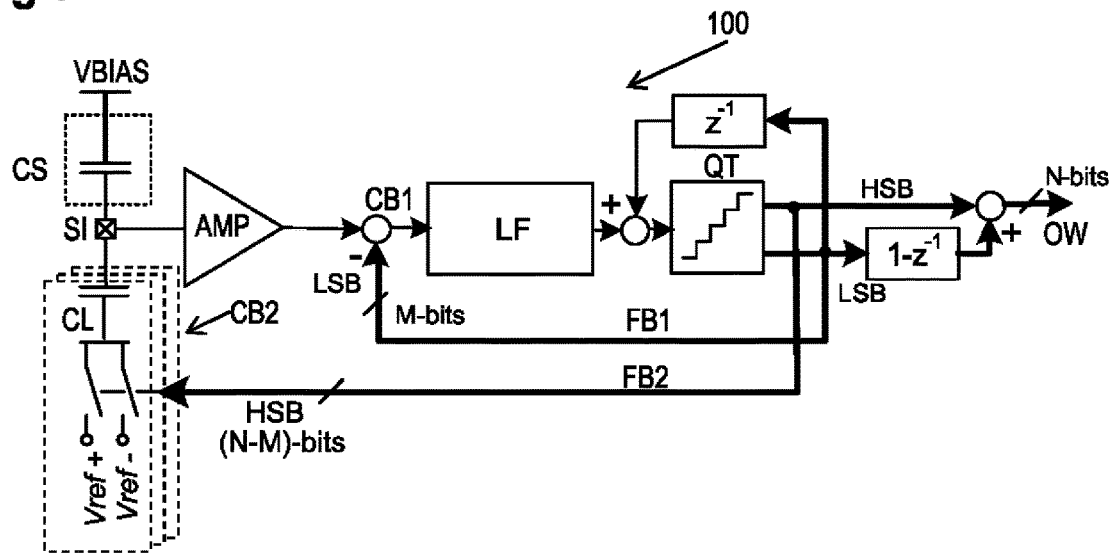
FIG. 6 shows a further example implementation of a signal processing arrangement.

FIG. 6 shows another example implementation of a sensor arrangement, which is based on the embodiments of FIG. 1 respectively FIG. 5. In particular, the noise coupling approach of FIG. 5 is also included in this example implementation. However, the main aspect of the example implementation of FIG. 6 is given by the configuration of the second feedback path FB2, which will now be explained in more detail. Hence, the noise coupling elements, i.e. the two processing blocks introduced in FIG. 5, could also be omitted in this example implementation.

In FIG. 6 the second feedback path FB2 comprises one or more level shift capacitors CL having a first end connected to the signal input SI and a second end coupled to two respective reference voltage sources Vref+, Vref−, which should be understood as a place holder for a plurality of reference voltage sources. The exact number of voltage reference sources depends on the number of higher significance bits HSB N−M, which may also be the number of level shift capacitors CL. Each of the reference voltage sources is connected to the respective level shift capacitor CL by an associated switch that is controlled depending on the higher significance bits HSB.

Referring to the time domain diagram in FIG. 2B, the level shifting may be performed either with a positive shifting voltage or a negative shifting voltage, defined by the reference voltage sources Vref+, Vref−. Additionally, if none of the higher significance bits has a non-zero value, no shifting of the voltage at the signal input SI is performed. A gain of the second feedback path according to the example implementation of FIG. 6 depends on the reference voltages provided by the reference voltage sources and a ratio between the capacitance of the level shift capacitor CL and the capacitance of the capacitive sensor CS.

Apparently, at least two positive and two negative voltage reference sources have to be provided to effect a signal corresponding to FIG. 2B.

In developments of the implementation of FIG. 6, a digital muting algorithm may be added to the output of the signal processing arrangement, which masks the swinging time instances of the HSB feedback in the second feedback path FB2. For example, the digital muting algorithm may suppress audible "clicks" and "pops", which may potentially occur at switching instances in the feedback paths.

Figure 7:
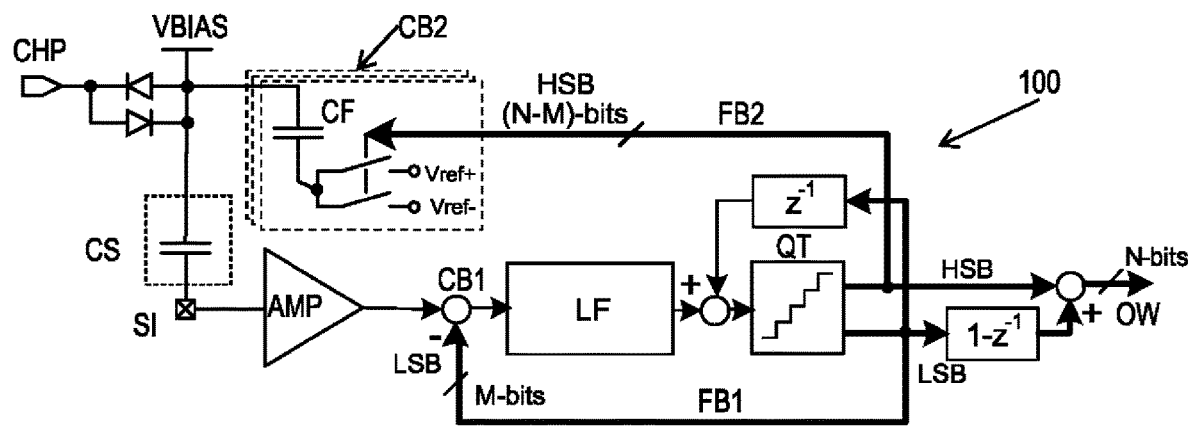
FIG. 7 shows a further example embodiment of a signal processing arrangement.

FIG. 7 shows a further implementation example of the sensor arrangement with a capacitive sensor CS, which is based on the implementation of FIG. 1 and FIG. 5, respectively. As explained for the previous example in FIG. 6, the processing blocks for the noise coupling included in the example of FIG. 5 could also be omitted for the example implementation of FIG. 7. Accordingly, only the differences with respect to the implementations of FIG. 1, respectively FIG. 5, are explained in the following. These differences relate to an alternative implementation of the second feedback path FB2.

In this example implementation the second feedback path comprises one or more bias filter capacitors CF having a first end connected to the bias connection VBIAS and a second end coupled to a first and a second reference voltage source Vref+, Vref− via a respectively associated switch. The bias filter is, so to say, split into N−M bias filter capacitors CF. The switches are controlled on the basis of the one or more higher significance bits HSB. The bias connection VBIAS is connected to a terminal CHP for connecting a charge pump via two anti-parallel connected diodes. Accordingly, the filter capacitors CF also performs a filtering of a charge pump signal provided at the terminal CHP.

Similar to the embodiment of FIG. 6, the two reference voltage sources are only shown as a place holder for a specific number of reference voltage sources that is determined by the bit length N−M of the higher significance bits HSB. The switching scheme and effect is comparable to the implementation of FIG. 6, such that the voltage level at the signal input SI is effectively shifted such that the input signal of the amplifier circuit AMP is held in a safe operating range.

Compared to the embodiment of FIG. 6, this implementation avoids a level shifting capacitor at the amplifier input, such that the signal is not attenuated. Additionally, a high accuracy can be achieved with the embodiment of FIG. 7, in particular if the capacitance of the filter capacitor CF is larger than an actual capacitance of the capacitive sensor CS.

Also for the implementation of FIG. 7, a digital muting algorithm can be provided, as discussed above for the implementation of FIG. 6.

Various implementation forms of the improved signal processing concept have been described above. According to the improved concept, the input signal provided by the capacitive sensor is not attenuated but shifted by a reference voltage level. Several levels can be applied, if more than one higher significance bit is fed back in the second feedback path FB2.

According to the improved concept no signal observation is required, in particular with respect to high input amplitudes and/or zero crossings, as the feedback of the sigma-delta modulator already tracks the input signal. By segmentation of the digital feedback, it is possible to distinguish between small input signals, represented by the lower significance bits, and large input signals, represented by the higher significance bits HSB.

Assuming a conventional selection of the sampling frequency of the sigma-delta modulator, respectively the quantizer, the input is switched at said sampling frequency, which is well outside the frequency band of interest.

Referring to the example implementations shown in FIG. 1, FIG. 5, FIG. 6 and FIG. 7, and using a more general language, the improved signal processing concept can be implemented with amplification of an input signal to generate an intermediate signal, for example the input signal of the amplifier circuit AMP and the intermediate signal at the output of the amplifier circuit AMP.

The intermediate signal is combined with a first feedback signal, e.g. provided by the first feedback path FB1, to generate a combination signal, e.g. the output of the first combiner CB1. The combination signal is filtered with a loop filter LF to generate a filtered signal. The filtered signal, or a signal derived therefrom, is quantized, e.g. by the quantizer QT, to provide a multi-bit output word. As described consistently above, the output word OW consists of one or more higher significance bits HSB and one or more lower significance bits LSB. The first feedback signal is generated as being representative of the one or more lower significance bits LSB, e.g. with the first feedback path FB1. A second feedback signal is generated as being representative of the one or more higher significance bits HSB, e.g. with one of the implementations of the second feedback path FB2. The second feedback signal is combined with the signal of the capacitive sensor CS to generate the input signal, e.g. of the amplifier circuit AMP.

REFERENCE NUMERALS

100 signal processing arrangement
CS capacitive sensor
SI signal input
AMP amplifier circuit
LF loop filter
QT quantizer
CB1, CB2 combiner
FB1, FB2 feedback paths
OW multi-bit output word
HSB higher significance bits
LSB lower significance bits N length of output word
M number of lower significance bits
N–M number of higher significance bits
CL level shift capacitor
CF filter capacitor
VBIAS bias connection
Vref+, Vref– reference voltage source

The invention claimed is:

1. A signal processing arrangement for a capacitive sensor, the signal processing arrangement comprising:
   a signal input for connecting the capacitive sensor;
   an amplifier circuit coupled to the signal input at its input side and to a feedback point at its output side;
   a loop filter coupled downstream to the feedback point;
   a quantizer connected downstream to the loop filter, the quantizer being configured to provide a multi-bit output word based on a signal at an input of the quantizer, the multi-bit output word consisting of one or more higher significance bits and one or more lower significance bits;
   a first feedback path coupled between an output of the quantizer and the feedback point for providing a first feedback signal to the feedback point, the first feedback signal being representative of the one or more lower significance bits; and
   a second feedback path coupled to the output of the quantizer for providing a second feedback signal to the signal input, the second feedback signal being representative of the one or more higher significance bits, the second feedback path comprising at least one level shift capacitor having a first end connected to the signal input and a second end coupled to at least one reference voltage source via an associated switch that is controlled on the basis of the one or more higher significance bits.

2. The signal processing arrangement of claim 1, wherein the second end of the at least one level shift capacitor is coupled to the at least one reference voltage source via the associated switch and to a further reference voltage source via a further associated switch, the at least one reference voltage source and the further reference voltage source being of different polarity, wherein the associated switch and the further associated switch are controlled on the basis of the one or more higher significance bits.

3. The signal processing arrangement of claim 1, wherein the second feedback path comprises a number of level shift capacitors, including the at least one level shift capacitor, the number of level shift capacitors corresponding to a number of higher significance bits of the multi-bit output word.

4. The signal processing arrangement of claim 3, wherein each of the level shift capacitors has a first end connected to the signal input and a second end coupled to respective first and second reference voltage sources of different polarity via associated switches that are controlled on the basis of the higher significance bits.

5. The signal processing arrangement of claim 1, wherein a gain of the second feedback path depends on reference voltages provided by the at least one reference voltage source and a ratio between a capacitance value of the level shift capacitor and a capacitance value of the capacitive sensor.

6. The signal processing arrangement of claim 1, wherein the first feedback path and the second feedback path each provide negative feedback.

7. The signal processing arrangement of claim 1, wherein the quantizer is configured to provide the multi-bit output word with a predefined sampling frequency and wherein the second feedback path provides the second feedback signal to the signal input with said sampling frequency.

8. The signal processing arrangement of claim 7, wherein the loop filter at least partially is implemented with discrete time elements operating with the sampling frequency.

9. The signal processing arrangement of claim 1, wherein the quantizer is configured to provide the multi-bit output word with a predefined sampling frequency, and wherein the sampling frequency is at least one order of magnitude higher than a maximum frequency of a predefined frequency band of interest.

10. The signal processing arrangement of claim 1, wherein the quantizer comprises a digital sigma-delta modulator for providing the one or more higher significance bits and the one or more lower significance bits from the multi-bit output word.

11. A signal processing arrangement for a capacitive sensor, the signal processing arrangement comprising:
    a signal input and a bias connection for connecting the capacitive sensor in-between;
    an amplifier circuit coupled to the signal input at its input side and to a feedback point at its output side;
    a loop filter coupled downstream to the feedback point;
    a quantizer connected downstream to the loop filter, the quantizer being configured to provide a multi-bit output word based on a signal at an input of the quantizer, the multi-bit output word consisting of one or more higher significance bits and one or more lower significance bits;
    a first feedback path coupled between an output of the quantizer and the feedback point for providing a first feedback signal to the feedback point, the first feedback signal being representative of the one or more lower significance bits; and
    a second feedback path coupled to the output of the quantizer for providing a second feedback signal to the signal input, the second feedback signal being representative of the one or more higher significance bits, the second feedback path comprising at least one bias filter capacitor having a first end connected to the bias connection and a second end coupled to at least one reference voltage source via an associated switch that is controlled on the basis of the one or more higher significance bits.

12. The signal processing arrangement of claim 11, wherein the second end of the at least one bias filter capacitor is coupled to the at least one reference voltage source via the associated switch and to a further reference voltage source via a further associated switch, the at least one reference voltage source and the further reference voltage source being of different polarity, wherein the associated switch and the further associated switch are controlled on the basis of the one or more higher significance bits.

13. The signal processing arrangement of claim 11, wherein the second feedback path comprises a number of bias filter capacitors, including the at least one bias filter capacitor, the number of bias filter capacitors corresponding to a number of higher significance bits of the multi-bit output word.

14. The signal processing arrangement of claim 13, wherein each of the bias filter capacitors has a first end connected to the bias connection and a second end coupled to respective first and second reference voltage sources of different polarity via associated switches that are controlled on the basis of the higher significance bits.

15. The signal processing arrangement of claim 11, wherein a capacitance value of the bias filter capacitor is larger than a capacitance value of the capacitive sensor.

16. The signal processing arrangement of claim 11, wherein the bias connection is connected to a charge pump for providing a bias voltage that is higher than a supply voltage of the signal processing arrangement.

17. A sensor arrangement comprising a signal processing arrangement according to claim 1 and a capacitive sensor connected to the signal input.

18. A sensor arrangement comprising a signal processing arrangement according to claim 11 and a capacitive sensor connected to the signal input.

19. A signal processing method for processing a signal of a capacitive sensor at a signal input, the method comprising:
    amplifying an input signal to generate an intermediate signal;
    combining the intermediate signal with a first feedback signal to generate a combination signal;
    filtering the combination signal with a loop filter to generate a filtered signal;
    quantizing the filtered signal to provide a multi-bit output word, the multi-bit output word consisting of one or more higher significance bits and one or more lower significance bits;
    generating the first feedback signal as being representative of the one or more lower significance bits;
    generating a second feedback signal as being representative of the one or more higher significance bits; and
    combining the second feedback signal with the signal of the capacitive sensor to generate the input signal; wherein
    the second feedback signal is generated
    via at least one level shift capacitor having a first end connected to the signal input and a second end coupled to at least one reference voltage source via an associated switch that is controlled on the basis of the one or more higher significance bits; or
    via at least one bias filter capacitor having a first end connected to a bias connection and a second end coupled to at least one reference voltage source via an associated switch that is controlled on the basis of the one or more higher significance bits, the capacitive sensor being connected between the signal input and the bias connection.

* * * * *